United States Patent
Yang et al.

(10) Patent No.: US 9,257,645 B2
(45) Date of Patent: Feb. 9, 2016

(54) MEMRISTORS HAVING MIXED OXIDE PHASES

(75) Inventors: Jianhua Yang, Palo Alto, CA (US); Minxian Max Zhang, Mountain View, CA (US); Feng Miao, Mountain View, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/232,521

(22) PCT Filed: Jul. 14, 2011

(86) PCT No.: PCT/US2011/044024
§ 371 (c)(1),
(2), (4) Date: Jan. 13, 2014

(87) PCT Pub. No.: WO2013/009316
PCT Pub. Date: Jan. 17, 2013

(65) Prior Publication Data
US 2014/0167042 A1    Jun. 19, 2014

(51) Int. Cl.
*H01L 45/00* (2006.01)
*G11C 13/00* (2006.01)

(52) U.S. Cl.
CPC ........ *H01L 45/1608* (2013.01); *G11C 13/0007* (2013.01); *H01L 45/08* (2013.01); *H01L 45/1233* (2013.01); *H01L 45/146* (2013.01); *H01L 45/147* (2013.01); *H01L 45/1616* (2013.01); *H01L 45/1625* (2013.01)

(58) Field of Classification Search
CPC ... H01L 45/08; H01L 45/1233; H01L 45/146; H01L 45/1608; H01L 45/1616; H01L 45/1625; H01L 45/147; G11C 13/0007
See application file for complete search history.

(56) References Cited

U.S. PATENT DOCUMENTS

| | | | |
|---|---|---|---|
| 5,589,733 A | 12/1996 | Noda et al. | |
| 6,036,823 A | 3/2000 | Inoguchi et al. | |
| 6,099,979 A | 8/2000 | Inoguchi et al. | |
| 6,649,957 B2 | 11/2003 | Hsu et al. | |
| 7,820,996 B2 | 10/2010 | Lee et al. | |
| 2007/0120124 A1* | 5/2007 | Chen et al. | 257/43 |
| 2008/0090337 A1 | 4/2008 | Williams | |
| 2009/0026433 A1 | 1/2009 | Chiang | |
| 2009/0279343 A1* | 11/2009 | Chang et al. | 365/148 |
| 2010/0002491 A1* | 1/2010 | Hwang et al. | 365/148 |
| 2010/0163823 A1 | 7/2010 | Sim et al. | |

FOREIGN PATENT DOCUMENTS

JP    2011091329    5/2011

OTHER PUBLICATIONS

PCT Search Report dated Jul. 16, 2012, PCT Patent Application No. PCT/US2011/044024 filed Jul. 14, 2011, Korean Intellectual Property Office.

* cited by examiner

*Primary Examiner* — Victor A Mandala
*Assistant Examiner* — Quovaunda V Jefferson
(74) *Attorney, Agent, or Firm* — Hewlett Packard Enterprise Patent Department

(57) ABSTRACT

A memristor includes a first electrode; a second electrode; and a switching layer interposed between the first electrode and the second electrode, wherein the switching layer includes an electrically semiconducting or nominally insulating and weak ionic switching mixed metal oxide phase for forming at least one switching channel in the switching layer. A method of forming the memristor is also provided.

16 Claims, 3 Drawing Sheets

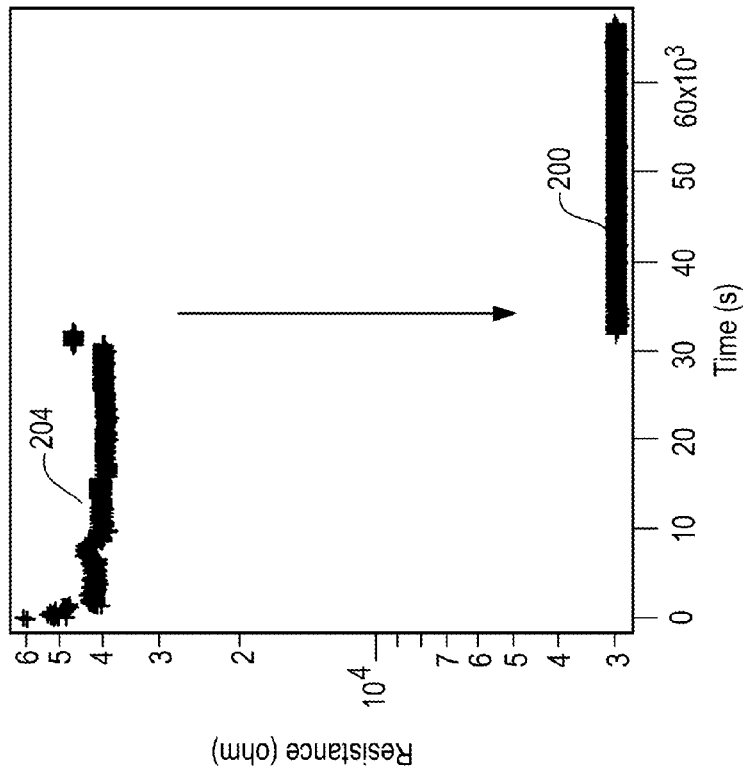
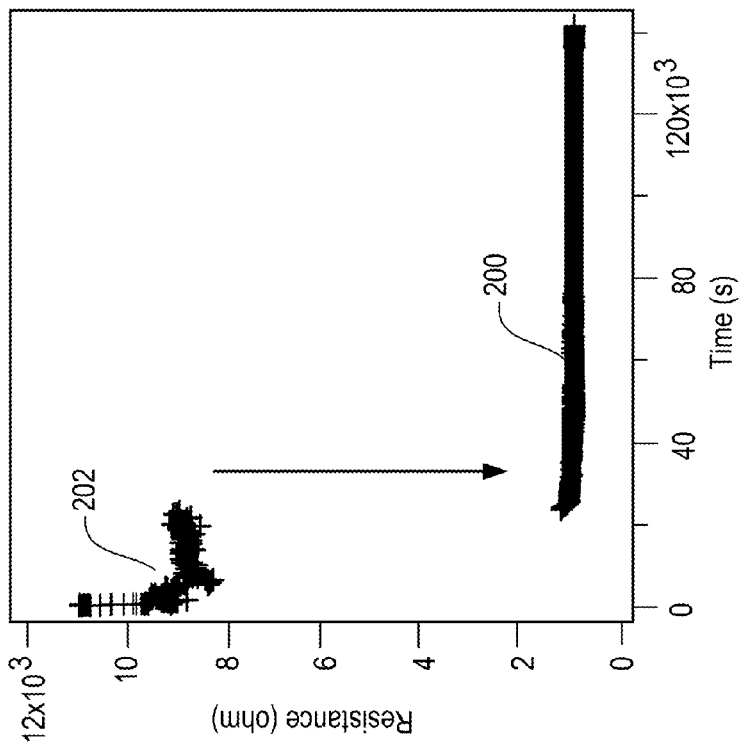
Fig. 2A
Fig. 2B

MEMRISTORS HAVING MIXED OXIDE PHASES

STATEMENT OF GOVERNMENT INTEREST

This invention was made with government support under Contract No. HR0011-09-3-0001, awarded by Defense Advanced Research Projects Agency. The government has certain rights in the invention.

BACKGROUND

The continuous trend in the development of electronic devices has been to minimize the sizes of the devices and to improve functionalities of the devices. While the current generation of commercial microelectronics are based on submicron design rules, significant research and development efforts are directed towards exploring devices on the nanoscale, with the dimensions of the devices often measured in nanometers or tens of nanometers. In addition to the significant reduction of individual device size and much higher packing density as compared to microscale devices, nanoscale devices may also provide new functionalities due to physical phenomena on the nanoscale that are not observed on the micron scale.

For instance, electronic switching in nanoscale devices using titanium oxide as the switching material has recently been reported. The resistive switching behavior of such a device has been linked to the memristor circuit element theory originally predicted in 1971 by L. O. Chua. The discovery of the memristive behavior in the nanoscale switch has generated significant interest, and there are substantial on-going research efforts to further develop such nanoscale switches and to implement them in various applications. One of the many important potential applications is to use such a switching device as a memory unit to store digital data.

Memristor switch devices, which are often formed of nanoscale metal/metal oxide/metal layers, employ an "electroforming" process to enable resistive switching. The electroforming process involves a one-time application of a relatively high voltage or current that produces a significant change of electronic conductivity through the metal oxide layer. The electrical switching arises from the coupled motion of electrons and ions within the oxide material. For example, during the electroforming process, oxygen vacancies can be created and drift towards the cathode, forming localized conducting channels in the oxide. Simultaneously, $O^{2-}$ ions drift towards the anode where they evolve $O_2$ gas and cause physical deformation of the junction. The gas eruption often results in physical deformation of the oxide, such as bubbles, near the locations where the conducting channels form, and the delamination between oxide and electrode. The conducting channels formed through the electroforming process often have a wide variance of properties depending on how the electroforming process occurred. This variance of properties has relatively limited the adoption of metal oxide switches in computing devices.

In addition, in order to be competitive with CMOS FLASH memories, the emerging resistive switches need to have a switching endurance that exceeds at least millions of switching cycles. Reliable switching channels inside the device may significantly improve the endurance of these switches.

BRIEF DESCRIPTION OF THE DRAWINGS

The detailed description will make reference to the following drawings, in which like reference numerals may correspond to similar, though perhaps not identical, components. For the sake of brevity, reference numerals having a previously described function may or may not be described in connection with other drawings in which they appear.

FIGS. 2A and 2B, each on coordinates of resistance (ohms) and time (seconds), are plots of resistance jumps due to some electrical perturbation.

DETAILED DESCRIPTION

Figure 1:
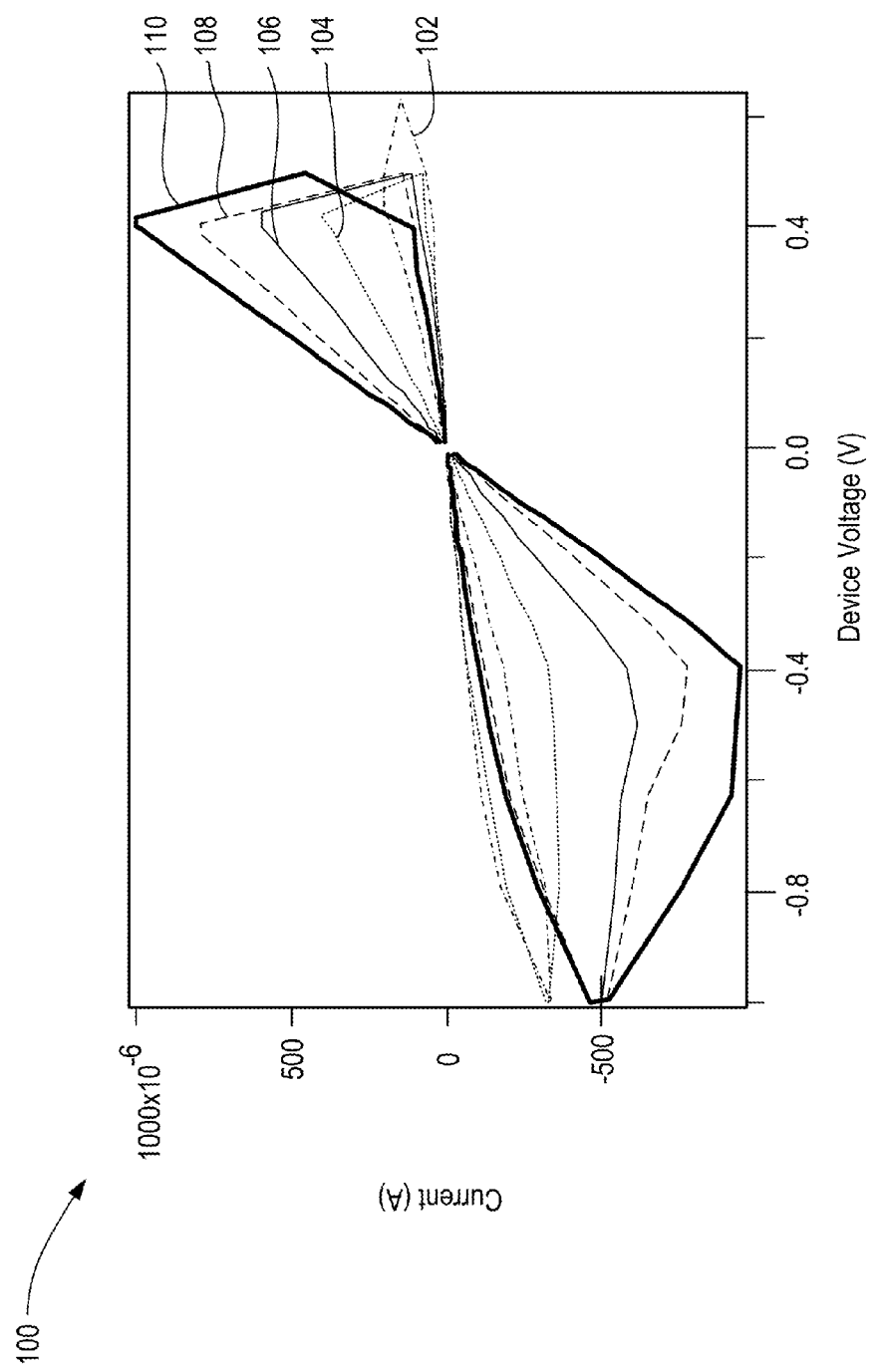
FIG. 1, on coordinates of current (A) and device voltage (V), is a plot of an example of multilevel operations.

Reference is now made in detail to specific examples of the disclosed memristor having mixed oxide phases and specific examples of ways for creating the disclosed memristor having mixed oxide phases. When applicable, alternative examples are also briefly described.

As used herein, the singular forms "a," "an," and "the" include plural referents unless the context clearly dictates otherwise.

As used in this specification and the appended claims, "approximately" and "about" mean a ±10% variance caused by, for example, variations in manufacturing processes.

In the following detailed description, reference is made to the drawings accompanying this disclosure, which illustrate specific examples in which this disclosure may be practiced. The components of the examples can be positioned in a number of different orientations and any directional terminology used in relation to the orientation of the components is used for purposes of illustration and is in no way limiting. Directional terminology includes words such as "top," "bottom," "front," "back," "leading," "trailing," etc. Herein, the term 'about' when applied to a value generally means plus or minus 10% unless otherwise expressly specified. Moreover, examples herein are intended to be illustrative only and are presented for discussion purposes and not by way of limitation.

It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims.

Memristors are nano-scale devices that may be used as a component in a wide range of electronic circuits, such as memories, switches, and logic circuits and functions. When used as a basis for memories, the memristor may be used to store a bit of information, 1 or 0. In a memory structure, a crossbar array of memristors may be used. When used as a logic circuit, the memristor may be employed as bits in a logic circuit that resembles a Field Programmable Gate Array, or may be the basis for a wired-logic Programmable Logic Array.

When used as a switch, the memristor may either be a closed or open switch in a cross-point memory. Throughout the last few years, researchers have made great progress to improve the switching efficiency of these memristors. For example, tantalum oxide ($TaO_x$)-based memristors have demonstrated superior endurance over other nanoscale devices capable of electronic switching. In lab settings, tantalum oxide-based memristors have demonstrated over 10 billion switching cycles whereas other memristors, such as tungsten oxide ($WO_x$) or titanium oxide ($TiO_x$) based memristors, require a sophisticated feedback mechanism for avoiding over-driving the devices or an additional step of refreshing the devices with stronger voltage pulses in order to obtain an endurance in the range of 10 million switching cycles.

$TaO_x$-based memristors with such superior endurance may be a candidate for non-volatile memory applications. Multi-level cells with $TaO_x$ are one feasible solution to achieve ultra-high density memory. By "multi-level" is meant that bits are stored as different resistance levels in chip cells, and these levels are changed by applying a voltage to the cells. $TaO_x$, for example, has an almost unlimited number of intermediate states between fully ON and fully OFF.

FIG. 1 is a plot 100 showing an example of multilevel operations. Switching is ON by +1 V and OFF by −1 V. The current compliance for ON switching is 200 µA (Curve 102), 400 µA (Curve 104), 600 µA (Curve 106), 800 µA (Curve 108), and 1,000 µA (Curve 110).

Memristors using $TaO_x$ alone have shown exceptionally high endurance (>$10^{10}$ cycles) and have stable ON and OFF states, but the intermediate states have been found to be meta-stable, resulting in a jump of the memristor to the ON state after only hours of operation. This effect is apparently due to diffusion of the mobile species ($O^{2-}$) in the $TaO_x$ layer.

FIGS. 2A and 2B give two examples of the instability of intermediate states. In FIG. 2A, at an intermediate state 200 of about 8 KΩ, there was a jump to the ON state 202, whereas in FIG. 2B, at an intermediate of about 50 KΩ 204, there was a jump to the ON state 202. In both cases, the jump to the ON state 202 took place after continuous reading operations (at room temperature) after about 9 hours.

The ON state appears to be stable. Also, intermediate states smaller than 8 KΩ appear to be stable.

Without subscribing to any particular theory, it appears that either thermal or electrical perturbations may cause the instability in the intermediate states. Such instability leads to reduced retention and reliability. Essentially, the diffusion or drift of the mobile species ($O^{2-}$) in the $TaO_x$ material is too high.

Figure 3:
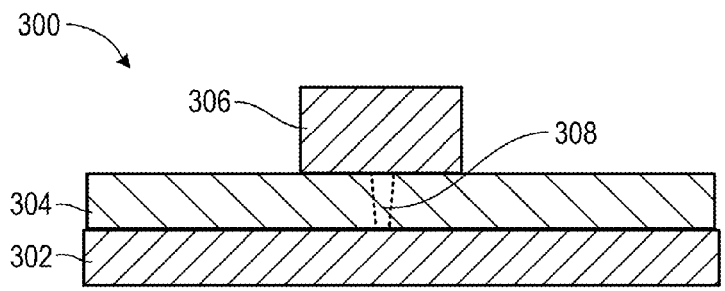
FIG. 3 is an example of a memristor device.

An example of the device exhibiting the instability of intermediate states is depicted in FIG. 3. The device 300 includes a bottom, or first, electrode 302, a metal oxide layer, or switching layer, 304, and a top, or second, electrode 306.

In an example, the bottom electrode 302 may be platinum having a thickness of about 10 to 100 nm, the metal oxide 304 may be tantalum oxide ($Ta_2O_5$) having a thickness of about 3 to 20 nm, and the top electrode 306 may be tantalum having a thickness of about 10 to 100 nm. The thickness range for the bottom electrode 302 includes nano scale crossbar devices.

In some examples, the switching function of the memristor is achieved in the switching layer 304. In general, the switching layer 304 is a weak ionic conductor that is semiconducting and/or insulating without dopants. These materials can be doped by native dopants, such as oxygen vacancies or impurity dopants (e.g. intentionally introducing different metal ions into the switching layer 304). The resulting doped materials are electrically conductive because the dopants are electrically charged and mobile under an electric field that may be assisted by Joule heating. Accordingly, the concentration profile of the dopants inside the switching layer 304 can be reconfigured by electric fields, leading to the resistance change of the device under electric fields, namely, electrical switching.

In some examples, the switching layer 304 may include a transition metal oxide, such as tantalum oxide, titanium oxide, yttrium oxide, hafnium oxide, zirconium oxide, or other like oxides, or may include a metal oxide, such as aluminum oxide, calcium oxide, or magnesium oxide, or other like oxides. In one example, the switching layer 304 may include the oxide form of the metal of one of the electrodes 302, 306. In alternate examples, the material of switching layer 304 may be ternary oxides, quaternary oxides, or other complex oxides, such as strontium titanate oxide (STO) or praseodymium calcium manganese oxide (PCMO). In yet other examples, the switching layer 304 may include nitrides and/or sulfides.

An annealing process or other thermal forming process, such as heating by exposure to a high temperature environment or by exposure to electrical resistance heating or other suitable processes, may be employed to form one or more switching channels 308 in the switching layer 304 to cause localized atomic modification in the switching layer. In some examples, the conductivity of the switching channels may be adjusted by applying different biases across the first electrode 302 and the second electrode 306. In other examples, the switching layer 304 may be singularly configurable. In yet other examples, the memristor's switching layer 304 may be a single layer, a bi-layer, or a multi-layer structure. For example, in a bi-layer structure, the device can have a relatively thin mixed metal oxide layer (for example, about 3 to 6 nm thick) and a relatively thick heavily reduced oxide layer (for example, about 10 to 200 nm thick). In these examples, also known as forming-free memristors, no process for forming a switching channel(s) is needed, since the oxide layer is so thin that there is no need to apply a high voltage or heat to form the switching channel(s). The voltage applied during normal operation of the switch is sufficient for forming a switching channel.

In one example, the memristor may be switched OFF and ON when oxygen or metal atoms move in the electric field, resulting in the reconfiguration of the switching channel in the switching layer 304. Particularly, when the atoms move such that the formed switching channel 308 reaches from the first electrode 302 to the second electrode 306 (as shown in FIG. 3), the memristor is in the ON state and has a relatively low resistance to the voltage supplied between the first electrode and the second electrode. Likewise, when the atoms move such that the formed switching channel 308 has a gap known as the switching region (not shown) between the first electrode 302 and the second electrode 306, the memristor is in the OFF state and has a relatively high resistance to the voltage supplied between the first electrode and the second electrode. In some examples, more than one switching channel may be formed in the switching layer 304.

The switching layer 304 may be between the first electrode 302 and the second electrode 306. In some examples, the first electrode 302 and the second electrode 306 may include any conventional electrode material. Examples of conventional electrode materials may include, but are not limited to, aluminum (Al), copper (Cu), gold (Au), molybdenum (Mo), niobium (Nb), palladium (Pd), platinum (Pt), ruthenium (Ru), ruthenium oxide ($RuO_2$), silver (Ag), tantalum (Ta), tantalum nitride (TaN), titanium nitride (TiN), tungsten (W), and tungsten nitride (WN).

In accordance with the teachings herein, the immunity to thermal or electrical perturbation is improved in the intermediate states by slowing down the diffusion or drift of the mobile species ($O^{2-}$) in the $TaO_x$ material. The result is improved retention and reliability.

One way to slow down the diffusion or drift of the mobile species is to add another (at least one), thermodynamically more stable metal oxide into the $TaO_x$ material. For convenience, the less stable metal oxide (here, $TaO_x$, may be referred to as the "first metal oxide" and the more stable metal oxide may be referred to as the "second metal oxide". By "thermodynamically more stable" is meant an oxide having stronger chemical bonds. Specifically, the free energy of formation of the more stable metal oxide (second metal oxide) is more negative than the free energy of formation of the less stable metal oxide (first metal oxide). Examples of such materials that are thermodynamically more stable than $TaO_x$ include, but are not limited to, $SiO_2$, $Al_2O_3$, $HfO_2$, $ZrO_2$, $CaO$, $TiO_2$, $B_2O_3$, $Li_2O$, $MgO$, and $Y_2O_3$. In an example, the second metal oxide may be $SiO_2$ alone, $Al_2O_3$ alone, or a mixture of $SiO_2$ and $Al_2O_3$.

Likewise, these teachings may be extended to other metal oxides. Examples of such metal oxides and additional oxides, or second metal oxides, that are thermodynamically more stable than the metal oxides, or first metal oxides, are listed in the Table below. One or more of the additional metal oxides may be added to the first metal oxide.

| METAL OXIDE (FIRST METAL OXIDE) | ADDITIONAL OXIDE (SECOND METAL OXIDE) |
| --- | --- |
| $WO_x$ | $SiO_x$, $TiO_x$, $CaO_x$, $ZrO_x$, $HfO_x$, or $YO_x$ |
| $TiO_x$ | $CaO_x$, $ZrO_x$, $HfO_x$, or $YO_x$ |
| $HfO_x$ | $LaO_x$, $SmO_x$, or $SrO_x$ |
| $ErO_x$ | $SmO_x$ |
| $YO_x$ | $SrO_x$ |
| $ZrO_x$ | $LaO_x$, $SmO_x$, or $SrO_x$ |

In all cases, the use of "x" in "$O_x$" is the oxygen/metal ratio in the oxide, or the number of oxygen atoms per metal atom (i.e., where x=2.5 is equivalent to $TaO_{2.5}=Ta_2O_5$). This is in contrast to the use of "x" in a metal oxide formula such as $Ta_2O_{5-x}$ (or $TaO_{2.5-x}$), in which case "x" is used to denote the oxygen deficiency from $Ta_2O_5$. In the latter case, the value of x may be less than about 0.2.

In all cases, the metal oxide/additional oxide system may have the following features: (1) only two stable solid phases are formed; one phase is relatively resistive and the other is relatively insulative; (2) the resistive phase has a certain amount of oxygen solubility. In particular, the oxygen solubility may range up to about 70 at %. While the oxygen solubility in the resistive phase would be about 22 at % in the bulk state, higher solubility may be achieved in a resistive phase that is in the nanoscale regime and is amorphous (often referred to as a Fermi glass).

The combination of the metal oxide/additional oxide need not form two separate phases, although this is one example. The combination may alternatively form a solid solution. In such a case, an amorphous structure may be formed, also called a Fermi glass.

Typically, the amount of additional oxide added is about 30 atomic percent (at %). However, this value may be varied to some extent, so that, depending on the specific oxide systems, in general, the amount of additional oxide added may be in the range of about 10 to 70 at %. Further, more than one additional oxide may be added to achieve the desired result.

Without subscribing to any particular theory, it appears that the added oxide reduces diffusivity of elements within the oxide to stabilize the intermediate states. This effect may be due to a stronger bond between O and the metal in the more thermodynamically stable second metal oxide.

Figure 4:
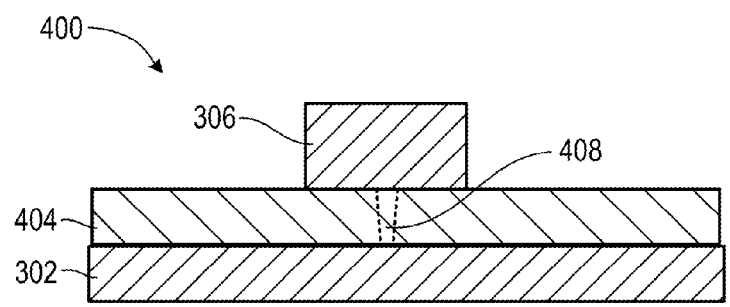
FIG. 4 is an example of a memristor device based on the principles disclosed herein.

FIG. 4 is a view similar to that of FIG. 3, but with the switching layer 304 of FIG. 3 replaced by a switching layer 404 in FIG. 4. The switching layer 404 has the same attributes and functionality as the switching layer 304, but has the combination of two (or more) metal oxides, as described above. Likewise, channel 408 has the same attributes and functionality as channel 308.

The memristor shown in FIG. 4 can be either non-crossbar (blank bottom electrode, blank oxide, patterned top electrode), or crossbar (patterned bottom electrode, patterned/blank oxide, and patterned top electrode).

The combination of the two metal oxides as disclosed herein may lead to ultra-high endurance (greater than 10 billion switching cycles) and retention (due to the presence of the additional metal oxide(s)) at the intermediate states for multi-level cell memory applications.

The mixed oxides may be formed by co-sputtering, sputtering with compounded targets, ALD (atomic layer deposition), alternating layer deposition (another ALD), evaporation with compounded sources, CVD with multiple sources, etc.

Figure 5:
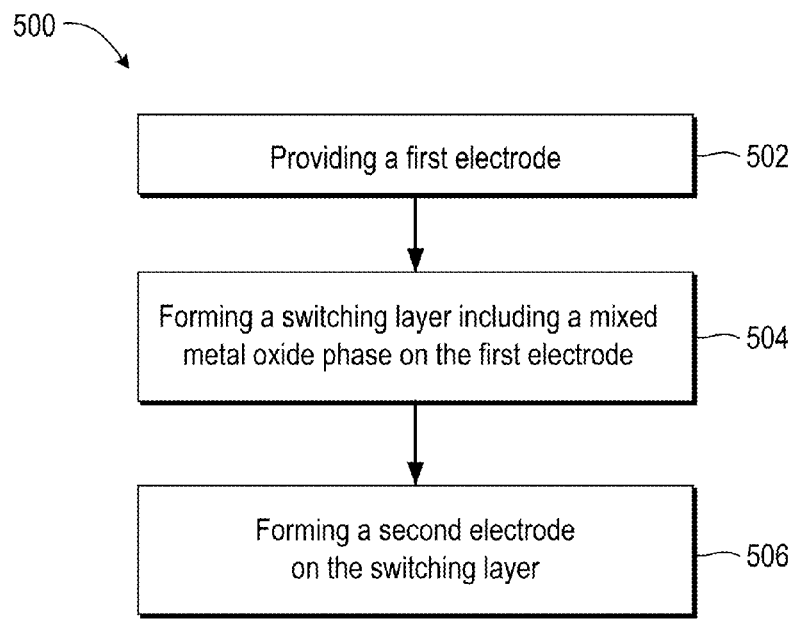
FIG. 5 is a flow chart depicting an example method for fabricating a memristor in accordance with the examples disclosed herein.

FIG. 5 is a flow chart depicting an example method 500 for fabricating a memristor in accordance with the examples disclosed herein. It should be understood that the method 500 depicted in FIG. 5 may include additional steps and that some of the steps described herein may be removed and/or modified without departing from the scope of the method 500.

The bottom, or first, electrode 302 may be formed 502, such as by sputtering, evaporation, ALD, co-deposition, chemical vapor deposition, IBAD (ion beam assisted deposition), or any other film deposition technology. The thickness of the first electrode 302 may be in the range of about 10 nm to a few micrometers.

The switching layer 404 may then be formed 504 on the electrode 302. In one example, the switching layer 404 may be an electronically semiconducting or nominally insulating and weak ionic conductor. The switching layer 404 may be deposited by sputtering, atomic layer deposition, chemical vapor deposition, evaporation, co-sputtering (using two metal oxide targets, for example), or other such process. The thickness of the switching layer 404 is approximately 4 to 20 nm.

The top, or second, electrode 306 may be formed 506 on the switching layer 404. The electrode 306 may be provided through any suitable formation process, such as described above for forming the first electrode 302. In some examples, more than one electrode may be provided. The thickness of the second electrode 306 may be in the range of about 10 nm to a few micrometers.

Either or both electrodes 302, 306 may be a combination of a first conductive layer, such as platinum, a second, relatively thin diffusion barrier layer, such as a metal nitride (e.g., TiN), and a third, relatively thick conductive layer, such as copper.

The assembly 400 including the switching layer 404 may be heated in order to improve the quality of the oxides. Heating can be accomplished using any of several different processes, including thermal annealing or applying electrical current through the devices. In some examples, the switching layer 404 alone may be heated directly. In the forming-free devices with built-in conductance channels 408, no heating is required to form the channels.

The sequence of the formation of the top and bottom electrodes may be changed in some cases.

It should be understood that the memristors described herein, such as the example memristor depicted in FIG. 4, may include additional components and that some of the components described herein may be removed and/or modified without departing from the scope of the memristor disclosed herein. It should also be understood that the components depicted in the Figures are not drawn to scale and thus, the components may have different relative sizes with respect to each other than as shown therein. For example, the upper, or second, electrode 306 may be arranged substantially perpendicularly to the lower, or first, electrode 302 or may be arranged at some other non-zero angle with respect to each other. As another example, the switching layer 404 may be relatively smaller or relatively larger than either or both electrode 302 and 306.

Advantageously, the mixed oxides provide high retention of the state they are switched into at chip temperature (85° C.). Further, there is a larger ON/OFF ratio (larger barrier due to larger bandgaps of second metal oxide (e.g., $SiO_2$, $Al_2O_3$, $HfO_2$, $ZrO_2$, CaO, $TiO_2$, $B_2O_3$, $Li_2O$, MgO, or $Y_2O_3$ in the case of $TaO_x$). The process is easy to implement and it is CMOS-compatible.

What is claimed is:

1. A memristor, including:
   a first electrode;
   a second electrode; and
   a switching layer interposed between the first electrode and the second electrode, wherein the switching layer includes an electrically semiconducting or nominally insulating and weak ionic switching mixed metal oxide phase for forming at least one switching channel in the switching layer, the mixed metal oxide phase comprising a first metal oxide and a second metal oxide, the second metal oxide being more thermodynamically stable than the first metal oxide so as to slow down diffusion or drift of a mobile species in the first metal oxide, the mixed metal oxide phase contained in a single layer.

2. The memristor of claim 1, wherein the first electrode and the second electrode each include a material independently selected from the group consisting of aluminum, copper, gold, molybdenum, niobium, palladium, platinum, ruthenium, ruthenium oxide, silver, tantalum, tantalum nitride, titanium nitride, tungsten, and tungsten nitride.

3. The memristor of claim 1, wherein the mixed metal oxide phase comprises two stable solid phases; one phase being relatively resistive and the other phase being relatively insulative and wherein the resistive phase has an amount of oxygen solubility up to about 70 at %.

4. The memristor of claim 3, wherein the mixed metal oxide phase comprises two separate phases.

5. The memristor of claim 3, wherein the mixed metal oxide phase comprises a Fermi glass.

6. The memristor of claim 3, wherein the first metal oxide and the second metal oxide are selected from the group consisting of
   $TaO_x$+any of $SiO_2$, $Al_2O_3$, $HfO_2$, $ZrO_2$, CaO, $TiO_2$, $B_2O_3$, $Li_2O$, MgO, and $Y_2O_3$;
   $WO_x$+any of $SiO_x$, $TiO_x$, $CaO_x$, $ZrO_x$, $HfO_x$, and $YO_x$;
   $TiO_x$+any of $CaO_x$, $ZrO_x$, $HfO_x$, and $YO_x$;
   $HfO_x$+any of $LaO_x$, $SmO_x$, and $SrO_x$;
   $ErO_x$+$SmO_x$;
   $YO_x$+$SrO_x$; and
   $ZrO_x$+any of $LaO_x$, $SmO_x$, and $SrO_x$.

7. The memristor of claim 6, wherein the switching layer comprises $TaO_x$ as the first metal oxide and one or both of $SiO_2$ and $Al_2O_3$ as the second metal oxide.

8. The memristor of claim 1, wherein the switching layer is one of a single layer, a bi-layer, or a multi-layer structure.

9. A method for fabricating the memristor of claim 1, the method including:
   providing the first electrode;
   forming the switching layer on the first electrode; and
   forming the second electrode on the switching layer.

10. The method of claim 9 further including heating at least the switching layer to improve the quality of the switching layer.

11. The method of claim 9, wherein forming the mixed metal oxide phase includes forming two stable solid phases; one phase being relatively resistive and the other phase being relatively insulative, wherein the resistive phase has an amount of oxygen solubility, up to about 70 at %.

12. The method of claim 11, wherein two separate phases are formed.

13. The method of claim 11, wherein a Fermi glass is formed.

14. The method of claim 9, wherein the switching layer is formed as a single layer, a bi-layer, or a multi-layer structure.

15. A memristor, including:
    a first electrode;
    a second electrode; and
    a switching layer interposed between the first electrode and the second electrode, wherein the switching layer includes an electrically semiconducting or nominally insulating and weak ionic switching mixed metal oxide phase for forming at least one switching channel in the switching layer;
    wherein the mixed metal oxide phase comprises two stable solid phases, one phase being relatively resistive and the other phase being relatively insulative;
    wherein the resistive phase has an amount of oxygen solubility up to about 70 at %;
    and wherein the mixed metal oxide phase comprises a Fermi glass.

16. A method for fabricating the memristor of claim 15, the method including:
    providing the first electrode;
    forming the switching layer including the mixed metal oxide phase on the first electrode; and
    forming the second electrode on the switching layer;
    wherein forming the switching layer including the mixed metal oxide phase includes forming the two stable solid phases;
    wherein the resistive phase has the amount of oxygen solubility up to about 70 at %;
    and wherein the Fermi glass is formed.

* * * * *